United States Patent
Hsu et al.

(10) Patent No.: US 6,737,860 B2
(45) Date of Patent: May 18, 2004

(54) SYSTEM FOR CONTROLLING ROTATIONAL SPEED OF FAN ACCORDING TO REFERENCE CLOCK FREQUENCY

(75) Inventors: Chia-Chang Hsu, Hsinchu (TW); Yen-John Chen, Changhua (TW); Chung-Hsien Lin, Banchiau (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 10/206,322

(22) Filed: Jul. 29, 2002

(65) Prior Publication Data

US 2003/0020460 A1 Jan. 30, 2003

(51) Int. Cl.$^7$ .............................. G01P 3/56; H02P 5/06
(52) U.S. Cl. ....................... 324/161; 324/166; 324/173; 388/804; 388/805
(58) Field of Search .................... 324/161, 163, 324/166, 173, 174; 318/254, 461–465; 388/804–806, 811–815, 829, 831, 838

(56) References Cited

U.S. PATENT DOCUMENTS 3,753,067 A * 8/1973 Milligan .................. 388/811
3,940,670 A * 2/1976 Tanikoshi .................. 318/254
5,548,679 A * 8/1996 Kiyota ...................... 388/811
5,774,626 A * 6/1998 Shenk ....................... 388/815
6,121,747 A * 9/2000 Trachtenberg ............ 318/800
6,428,282 B1 * 8/2002 Langley ...................... 417/2
6,515,259 B1 * 2/2003 Hsu et al. ............... 219/130.51

* cited by examiner

Primary Examiner—N. Le
Assistant Examiner—Darrell Kinder
(74) Attorney, Agent, or Firm—Rabin & Berdo P.C.

(57) ABSTRACT

A system for controlling the rotational speed of a fan, according to a reference clock having a reference frequency, is disclosed. The rotational speed corresponds to a fan rotational speed signal. The fan rotational speed controlling unit compares the reference clock with the fan rotational speed signal, to output a speed controlling signal. The Voltage generating circuit generates a level signal corresponding to the speed controlling signal. The driving unit generates a driving signal to control the rotational speed of the fan according to the level signal. When the fan is assembled with the controlling system, only coils with the same number of turns need to be use to obtain various rated rotational speeds of fans of different specifications by altering the reference frequency of the controlling system. Because coils with different number of turns are not required in stock at the same time, the time cost and the manufacturing cost can be reduced.

13 Claims, 2 Drawing Sheets

SYSTEM FOR CONTROLLING ROTATIONAL SPEED OF FAN ACCORDING TO REFERENCE CLOCK FREQUENCY

CROSS-REFERENCE TO RELATED APPLICATION

This application incorporates by reference of Taiwan application Serial No. 90118506, filed Jul. 27, 2001.

BACKGROUND OF THE INVENTION

1. Field of the Invention

This invention relates in general to a control system. More specifically, the invention relates to a system for controlling the rotational speed of a fan.

2. Description of Related Art

As the technology of the computer progresses, compact and lightweight electronic products, such as the notebook computer, have become the main products in the market. In compact and lightweight electronic products, the products' ability to dissipate the heat generated usually affects the system stability, product performance, and product durability. For a computer system, in order to quickly dissipate the heat generated by the computer system, a heat dissipation device is usually assembled in the computer system, so that the computer system can work normally in an environment with a suitable temperature.

In a conventional computer system, the fan for dissipating heat is driven by a brushless DC motor. Conventionally, coils with different numbers of turns are assembled on the rotor of the motor to obtain fans meeting different specifications. For example, when a fan with a higher rated rotational speed is required, a coil with a large number of turns can be assembled, and when a fan with a lower rated rotational speed is required, a coil with a small number of turns is assembled. When the current is conducted, coils with different numbers of turns will generate magnetic fields with different strengths, so that the rotational speed of the motor is different and the rotational speed of the fan is changed accordingly.

When fans with different specifications are needed in the market, the provider has to have coils of various types in stock with respect to the number of turns. However, because the provider has to stock various coils, the material cost is increased. On the other hand, for the fans in which the numbers of turns of the coil are the same, the assembly tightness, eccentricity of the fan, difference of inertia of the fan, deviation of the coil shape, and so forth will affect the rotational speed of the fan. The provider needs to spend time to adjust the variable factors, which have influences on the rotational speed of the fan, to comply with the rated rotational speeds defined according to specifications of various types of the fan. Accordingly, the invention is designed to save time and cost, because conventional products must be tested or eliminated if they do not meet the required specifications, which will increase the manufacturing cost and the manufacturing time.

SUMMARY OF THE INVENTION

According to the foregoing description, an object of this invention is to provide a system for controlling the rotational speed of a fan, wherein coils with the same number of turns can be used to obtain various rated rotational speeds in fans of different specifications, by altering the reference frequency of the controlling system. Because coils with different number of turns are not required in stock at the same time, the time cost and the manufacturing cost can be reduced.

According to one object of the invention, the invention provides a system for controlling the rotational speed of a fan according to a reference clock having a reference frequency, and the rotational speed corresponds to a fan rotational speed signal. The system comprises a fan rotational speed controlling unit, a voltage generating circuit, and a driving unit. The fan rotational speed controlling unit is used for comparing the reference clock with the fan rotational speed signal, to output a speed control signal. The voltage generating circuit generates a level signal corresponding to the speed control signal. The driving unit generates a driving signal to control the rotational speed of the fan according to the level signal. The fan rotational speed controlling unit includes a reference rotational speed calculating unit for determining a reference rotational speed corresponding to the reference frequency; a fan rotational speed calculating unit for determining a fan rotational speed corresponding to the fan rotational speed signal; and a comparator for producing the speed control signal according to a difference between the reference rotational speed and the fan rotational speed, the speed control signal being indicative of accelerating, decelerating, or maintaining the rotational speed of the fan. The voltage generating circuit includes a charge pump which generates the level signal according to the speed control signal. The voltage generating circuit generates a level signal corresponding to the speed controlling signal. The driving unit generates a driving signal to control the rotational speed of the fan according to the level signal.

According to another object of the invention, the invention provides a system for controlling the rotational speed of a fan, wherein the rotational speed corresponds to a fan rotational speed signal. The system comprises a reference frequency generator, a fan rotational speed controlling unit, a voltage generating circuit, a pulse width modulation (PWM) generating circuit, and a fan driving circuit. The reference frequency generator is used for generating a reference clock having a reference frequency. The fan rotational speed controlling unit compares the reference clock with the fan rotational speed signal to output a speed control signal. The voltage generating circuit receives the speed control signal to obtain a level signal correspondingly. The pulse width modulation (PWM) generating circuit generates a square wave signal according to the level signal. The fan driving circuit receives the square wave signal to generate a driving signal to control the rotational speed of the fan.

BRIEF DESCRIPTION OF THE DRAWINGS

While the specification concludes with claims particularly pointing out and distinctly claiming the subject matter, which is regarded as the invention, the objects and features of the invention and further objects, features, and advantages thereof will be better understood from the following description and the accompanying drawings in which:

DESCRIPTION OF THE PREFERRED EMBODIMENT

The invention utilizes a feedback control to adjust a frequency of a fan rotational speed signal corresponding to the rotational speed of a fan to a value near a reference frequency. The reference frequency is adjustable, and the provider can adjust only the reference frequency to obtain a fan that complies with rated rotational speeds of various specifications.

Figure 1:
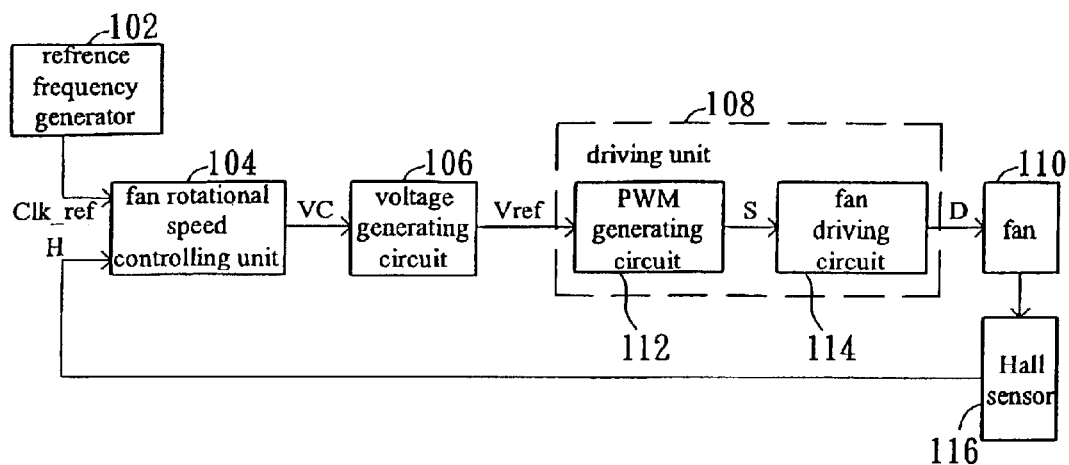
FIG. 1 is a schematic block diagram of a system for controlling the rotational speed of a fan according to one preferred embodiment of the invention.

FIG. 1 is a schematic block diagram of a system for controlling the rotational speed of a fan according to one preferred embodiment of the invention. Referring to FIG. 1, the controlling of the invention is used for controlling the rotational speed of the fan 110, and the rotational speed of the fan 110 corresponds to a fan rotational speed signal H. The reference frequency generator 102 is used for generating a reference clock Clk_ref having a reference frequency Fref. The fan rotational speed controlling unit 104 receives both the reference clock Clk_ref and the fan rotational speed signal H at the same time, and then compares the frequencies of both to obtain a speed control signal VC that is outputted to a voltage generating circuit 106. The voltage generating circuit 106 is used for generating a level signal Vref corresponding to the speed control signal VC. The level signal Vref is inputted into a driving unit 108 to generate a driving signal D for controlling the rotational speed of the fan 110 according to the level signal Vref.

The driving unit 108 is composed of a pulse width modulation (PWM) generating circuit 112 and a fan driving circuit 114. The PWM generating circuit 112 obtains a square wave signal S according to the level signal Vref. The fan driving circuit 114 receives the square wave signal S to generate a driving signal D for controlling the rotational speed of the fan 110. In addition, the fan rotational speed signal H can be obtained by using a Hall sensor 116 to detect a variation of the magnetic pole of the rotor of the fan.

The speed control signal VC output from the fan rotational speed controlling unit 104 can be an acceleration control signal, a deceleration control signal, or a maintain control signal. When the frequency of the fan rotational speed signal H is smaller than the reference frequency Fref of the reference clock Clk_ref, the fan rotational speed signal H is an acceleration control signal. When the frequency of the fan rotational speed signal H is larger than the reference frequency Fref of the reference clock Clk_ref, the fan rotational speed signal H is a deceleration control signal. When the frequency of the fan rotational speed signal H is equal to the reference frequency Fref of the reference clock Clk_ref, the fan rotational speed signal H is a maintain control signal.

The duty ratio of the square wave signal S generated by the PWM generating circuit 112 is varied according to the level signal Vref. When the speed control signal VC is the acceleration control signal, the level of the level signal Vref is increased to raise the duty ratio of the square wave signal S. When the speed control signal VC is the deceleration control signal, the level of the level signal Vref is decreased to reduce the duty ratio of the square wave signal S. When the speed control signal VC is the maintain control signal, the level of the level signal Vref is maintained to keep the duty ratio of the square wave signal S.

According to the controlling circuit of the invention, the reference frequency generator 102 can be an oscillator whose time constant can be adjusted. The user can adjust the time constant to alter the reference frequency Fref of the reference clock Clk ref. Because the reference frequency Fref is adjustable in the fan designed for various rated rotational speeds complying with specifications, only the reference frequency of the reference clock Clk ref has to be altered. Namely, only adjust the time constant of the oscillator in the reference frequency generator 102 needs adjustment. The time constant is determined by the values of the resistor and the capacitor of the oscillator, and therefore, the user can adjust only the values of the resistor and the capacitor to alter the time constant. By adjusting the reference frequency Fref, the rotational speed of the fan 110 can be changed, and the frequency of the fan rotational speed signal H can be changed accordingly.

Figure 2:
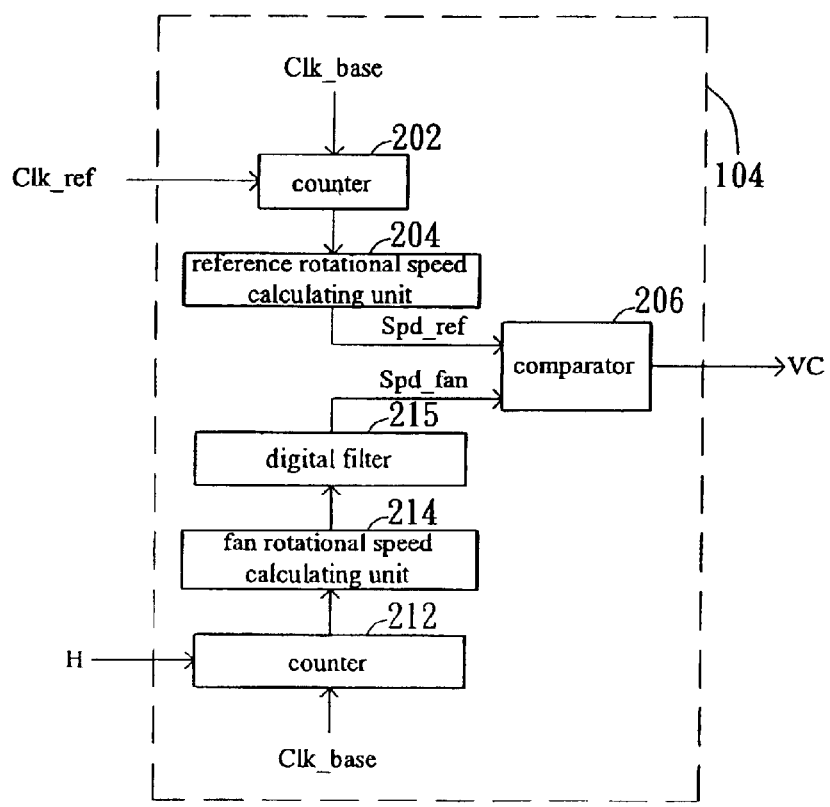
FIG. 2 is a detailed block diagram of the controlling unit of the fan rotational speed when the controlling unit in FIG. 1 is a phase locked loop.

Next, examples for each circuit block in FIG. 1 will be described in detail. The fan rotational speed controlling unit 104 can be a phase locked loop, for example. FIG. 2 is a detailed block diagram of the controlling unit of the fan rotational speed when the controlling unit in FIG. 1 is a phase locked loop. The reference clock Clk ref is inputted into a counter 202, and the counter 202 calculates the period of the reference clock Clk ref based on a base clock Clk base. The period is then inputted to a reference rotational speed calculating unit 204 to obtain a reference rotational speed Spd ref corresponding to the reference frequency Fref, which is then outputted to a comparator 206. In addition, the fan rotational speed signal H is inputted into the counter 212 at which the period of the fan rotational speed signal H is calculated based on the base clock Clk base. The period of the fan rotational speed signal H is further inputted into the fan rotational speed calculating unit 214 to obtain a fan rotational speed Spd fan corresponding to the fan rotational speed signal H. After the fan rotational speed Spd fan is processed by a digital filter 215, the result is outputted to the comparator 206. An error tolerance is set to the comparator 206. When the reference rotational speed Spd ref minus the fan rotational speed Spd fan is greater than the error tolerance, the speed control signal VC output from the comparator 206 is the acceleration control signal. When the fan rotational speed Spd fan minus the reference rotational speed Spd ref is greater than the error tolerance, the speed control signal VC output from the comparator 206 is the deceleration control signal. When the difference between the fan rotational speed Spd fan and the reference rotational speed Spd ref is smaller than the error tolerance, the speed control signal VC output from the comparator 206 is the maintain control signal.

The digital filter 215 can be a low pass filter, which eliminates irregular variations of the period of the fan rotational speed signal H due to inconsistent or irregular shapes of the magnetic poles in the rotor of the fan or due to a nonuniform magnetic field during operation, to increase the stability of the system.

The voltage generating circuit 106 can be a charge pump, for example. The charge pump is composed of a charging capacitor and a number of switches. The speed control signal VC controls these switches to charge or discharge the charging capacitor. The voltage of the charging capacitor is used as the level signal Vref. For example, the acceleration control signal reduces the voltage of the charging capacitor, the deceleration control signal increases the voltage of the charging capacitor, and the maintain control signal maintains the voltage of the charging capacitor. Accordingly, the level of the level signal Vref will be changed according to the different speed control signal VC.

Figure 3:
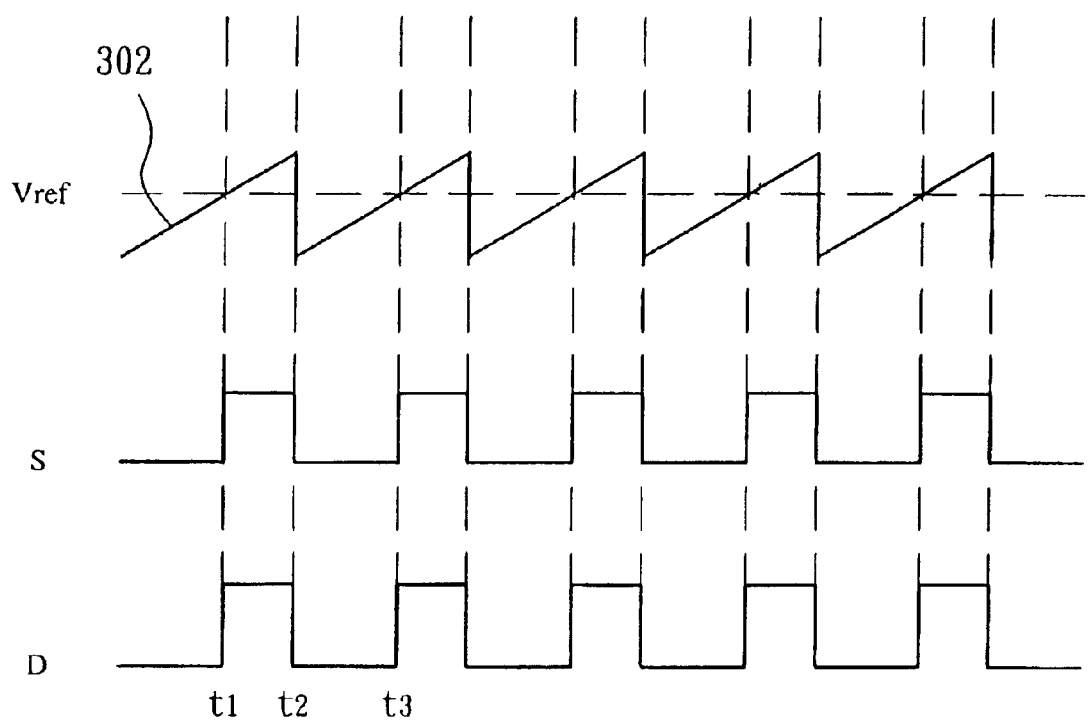
FIG. 3 shows waveforms of saw-tooth waves in the PWM generating circuit, square wave signals S, and driving signals D output from the PWM generating circuit.

As shown in FIG. 3, the PWM generating circuit 112 uses a saw-tooth wave generating circuit to generate a saw-tooth wave 302. The PWM generating circuit 112 generates a corresponding square wave signal S according to the level of the level signal Vref. For example, at time t1~t2, the level of the saw-tooth wave 302 is greater than that of the level signal Vref, and therefore, the square wave signal S is a high level. At time t2~t3, the level of the saw-tooth wave 302 is less than that of the level signal Vref, and therefore, the square wave signal S is a low level. Accordingly, when the level signal Vref decreases, the duty ratio of the square wave S increases.

The fan driving circuit 114 comprises a plurality of transistors, wherein these transistors perform the voltage and/or current amplifications to generate a driving signal D corresponding to the square wave signal S, as shown in FIG. 3. When the driving signal D is a high level, current flows through the coil of the rotor of the fan motor to generate a magnetic field so that the rotor is subjected to a magnetic force. When the driving signal D is a low level, no current flows through the coil of the rotor of the fan motor so that the rotor is not subjected to a magnetic force, i.e., the rotor moves due to its inertia. Therefore, the time when the driving signal stays at the high level is longer, the rotational speed of the fan motor becomes faster so that the rotational speed of the fan is increased. In other words, by adjusting the duty ratio of the driving signal D, the rotational speed of the fan can be altered.

As disclosed above, the driving unit 108 is composed of a PWM generating circuit 112 and a fan driving circuit 114. In addition to this example, the driving unit 108 can be implemented by other circuits with equivalent functions. For example, the driving unit 108 can be composed of a voltage-to-current converter for driving the fan 110 directly, wherein the voltage Vref can be designed to be converted into a square wave voltage signal.

Advantageously, the feedback control of the invention can effectively eliminate the influences on the rotational speed of the fan due to various deviations when the fan is prepared for the market. For the fans, in which the the number of turns of the coil are the same, the assembly tightness, eccentricity of the fan, difference of inertia of the fan, deviation of the coil shape, and so on will affect the rotational speed of the fan. According to the feedback controlling system of the invention, the feedback controlling system will automatically compensate for the above deviations and differences of different fans. Therefore, unlike the conventional technology, when the feedback controlling system is used, the user does not need to spend time to adjust the variable factors, influencing the rotational speed of the fan to comply with the rated rotational speeds defined according to specifications of various types of fan. Thus, the invention can reduce the time cost.

In the other words, when there are different needs for fans with different specifications in the market, the provider can use the controlling system of the invention to adjust the reference frequency to obtain different rated rotational speeds of fans of different specifications. Accordingly, unlike the conventional manner, the provider does not need to have coils with different number of turns in stock for the market. The provider only has to prepare one coil type to meet the requirements of providing fans of different specifications. Because only the values of the resistor and the capacitor of the reference frequency generator need to be adjusted and the adjusting method is very simple, the cost can be significantly reduced.

Additionally, the controlling system of the invention can provide a function for quickly adjusting the rotational speed of the fan. When the fan rotational speed controlling unit is a digital phase locked loop and because the generated speed control signal VC is definitely an acceleration signal, a deceleration signal or a maintain signal, the transient response time is short and therefore the rotational speed of the fan can be quickly adjusted to the reference rotational speed.

According to the system for controlling the rotational speed of the fan in the above embodiment, when a fan is assembled with the controlling system, coils with the same number of turns can be used to obtain various rated rotational speeds of fans of different specifications by altering the reference frequency of the controlling system. Because coils with different numbers of turns are not required in stock at the same time, the time cost and the manufacturing cost can be reduced.

While the present invention has been described by way of a preferred embodiment, the scope of the invention is not intended to be limited thereto. Various modifications of the embodiment will be apparent to those skilled in the art. Therefore the appended claims should be accorded the broadest interpretation so as to cover any such modifications.

What claimed is:

1. A system for controlling a rotational speed of a fan, according to a reference clock having a reference frequency, and the rotational speed corresponding to a fan rotational speed signal, the system comprising:
    a fan rotational speed controlling unit, for comparing the reference clock with the fan rotational speed signal, to output a speed control signal, the fan rotational speed controlling unit comprising:
        a reference rotational speed calculating unit for determining a reference rotational speed corresponding to the reference frequency;
        a fan rotational speed calculating unit for determining a fan rotational speed corresponding to the fan rotational speed signal; and
        a comparator, coupled to the reference rotational speed calculating unit and the fan rotational speed calculating unit, for producing the speed control signal according to a difference between the reference rotational speed and the fan rotational speed, the speed control signal being indicative of accelerating, decelerating, or maintaining the rotational speed of the fan;
    a voltage generating circuit, for generating a level signal corresponding to the speed control signal, the voltage generating circuit comprising a charge pump which generates the level signal according to the speed control signal; and
    a driving unit, for generating a driving signal to control the rotational speed of the fan according to the level signal.

2. The system of claim 1, wherein the reference frequency is adjustable, and by adjusting the reference frequency, the rotational speed of the fan is altered, so that a frequency of the fan rotational speed signal is altered accordingly.

3. The system of claim 1, wherein the driving unit uses a PWM method to alter a duty ratio of the driving signal according to the level signal, so that the rotational speed of the fan is changed.

4. The system of claim 1, further comprising a Hall sensor for detecting a variation of magnetic poles of a rotor of the fan to obtain the fan rotational speed signal.

5. The system of claim 1, wherein the speed control signal output from the fan rotational speed controlling unit is an acceleration control signal, a deceleration control signal or a maintain control signal;

when the frequency of the fan rotational speed signal is smaller than the reference frequency of the reference clock, the speed control signal is the acceleration control signal;

when the frequency of the fan rotational speed signal is greater than the reference frequency of the reference clock, the speed control signal is the deceleration control signal; and when the frequency of the fan rotational speed signal is substantially equal to the reference frequency of the reference clock, the speed control signal is the maintain control signal.

6. A system for controlling a rotational speed of a fan, wherein the rotational speed corresponds to a fan rotational speed signal, the system comprising:

a reference frequency generator, for generating a reference clock having a reference frequency;

a fan rotational speed controlling unit, for comparing the reference clock with the fan rotational speed signal to output a speed control signal, the fan rotational speed controlling unit comprising:

a reference rotational speed calculating unit for determining a reference rotational speed corresponding to the reference frequency;

a fan rotational speed calculating unit for determining a fan rotational speed corresponding to the fan rotational speed signal; and a comparator for producing the speed control signal according to a difference between the reference rotational speed and the fan rotational speed, the speed control signal being indicative of accelerating, decelerating, or maintaining the rotational speed of the fan;

a voltage generating circuit, for receiving the speed control signal to obtain a level signal correspondingly, the voltage generating circuit comprising a charge pump which generates the level signal according to the speed control signal;

a pulse width modulation (PWM) generating circuit, for generating a square wave signal according to the level signal; and a fan driving circuit, for receiving the square wave signal to generate a driving signal to control the rotational speed of the fan.

7. The system of claim 6, wherein the reference frequency is adjustable, and by adjusting the reference frequency, the rotational speed of the fan is altered, so that a frequency of the fan rotational speed signal is altered accordingly.

8. The system of claim 6, wherein the reference frequency generator includes an oscillator with an adjustable time constant, so that a user is capable of adjusting the time constant to alter the reference frequency.

9. The system of claim 6, further comprising a Hall sensor for detecting a variation of magnetic poles of a rotor of the fan to obtain the fan rotational speed signal.

10. The system of claim 6, wherein the speed control signal output from the fan rotational speed controlling unit is an acceleration control signal, a deceleration control signal or a maintain control signal;

when the frequency of the fan rotational speed signal is smaller than the reference frequency of the reference clock, the speed control signal is the acceleration control signal;

when the frequency of the fan rotational speed signal is greater than the reference frequency of the reference clock, the speed control signal is the deceleration control signal; and when the frequency of the fan rotational speed signal is substantially equal to the reference frequency of the reference clock, the speed control signal is the maintain control signal.

11. The system of claim 10, wherein a duty ratio of the square wave signal is changed according to the level signal;

when the speed control signal is the acceleration control signal, a level of the level signal is lowered to increase the duty ratio of the square wave signal; and when the speed control signal is the deceleration control signal, the level of the level signal is raised to reduce the duty ratio of the square wave signal.

12. The system of claim 1, wherein the fan rotational speed controlling unit further comprises:

a first counter, coupled to the reference rotational speed calculating unit, for calculating a period of the reference clock according to the reference clock and a base clock;

wherein the reference rotational speed calculating unit determines the reference rotational speed according to the period of the reference clock.

13. The system of claim 1, wherein the fan rotational speed controlling unit further comprises:

a second counter, coupled to the fan rotational speed calculating unit, for calculating a period of the fan rotational speed signal according to the fan rotational speed signal and a base clock;

wherein the fan rotational speed calculating unit determines the fan rotational speed according to the period of the fan rotational speed signal.

* * * * *